(12) United States Patent
Alley

(10) Patent No.: US 6,320,462 B1
(45) Date of Patent: Nov. 20, 2001

(54) AMPLIFIER CIRCUIT

(75) Inventor: Gary D. Alley, London Derry, NH (US)

(73) Assignee: Raytheon Company, Lexington, MA (US)

(*) Notice: Subject to any disclaimer, the term of this patent is extended or adjusted under 35 U.S.C. 154(b) by 0 days.

(21) Appl. No.: 09/547,548

(22) Filed: Apr. 12, 2000

(51) Int. Cl.$^7$ ...................................... H03F 3/68
(52) U.S. Cl. ................. 330/124 R; 330/295; 330/302
(58) Field of Search .................. 330/53, 124 R, 330/286, 295, 302

(56) References Cited

U.S. PATENT DOCUMENTS

| | | | |
|---|---|---|---|
| 2,210,028 | 8/1940 | Doherty | 330/84 |
| 4,916,410 | * 4/1990 | Littlefield | 330/295 |
| 5,127,102 | 6/1992 | Russell | 455/327 |
| 5,146,175 | * 9/1992 | Green, Jr. | 330/286 |
| 5,420,541 | 5/1995 | Upton et al. | 330/286 |
| 5,568,086 | 10/1996 | Schuss et al. | 330/124 R |
| 5,786,727 | * 7/1998 | Sigmon | 330/124 R |
| 6,085,074 | * 7/2000 | Cygan | 330/295 |

FOREIGN PATENT DOCUMENTS 0 255 652 A2  2/1988  (EP).

OTHER PUBLICATIONS

Toshio Nojima et al. "High Efficiency Transmitting Power Amplifiers for Portable Radio Units", 2334 The Transactions of the Institute of Electronics, Information and Comm. Engineers E74., No. 6, Jun. 6, 1991, pp. 1563–1570.

Emrys Williams, "Thermionic Valve Circuits", Sir Isaac Pitman & Sons, Ltd, 3$^{rd}$ Ed, 1952, pp. 124–125.

"Basic Electronics", Bureau of Naval Personnel, Dover Edition, published 1963, pp. 112–114, 304–305.

E.V.D. Glazier et al., "The Services" Textbook of Radio vol. 5, Transmission and Propagation, Her Majesty's Stationery Office, London, 1958, pp. 120–122.

Paul Horowitz et al., "The Art of Electronics 2$^{nd}$ Ed.", Cambridge University Press, 1989, pp. 881–882.

Frederick Emmons Terman, "Radio Engineering", 3$^{rd}$ Ed., McGraw-Hill Publishing Company Ltd, London, 1951, pp. 400–403.

* cited by examiner

Primary Examiner—Robert Pascal
Assistant Examiner—Khanh Van Nguyen
(74) Attorney, Agent, or Firm—Daly, Crowley & Mofford, LLP

(57) ABSTRACT

An RF amplifier includes a peak amplifier signal path, a carrier amplifier signal path and a delay line which equalizes the time delay between the peak and carrier amplifier signal paths to provide an amplifier having a relatively high power added efficiency characteristic.

28 Claims, 6 Drawing Sheets

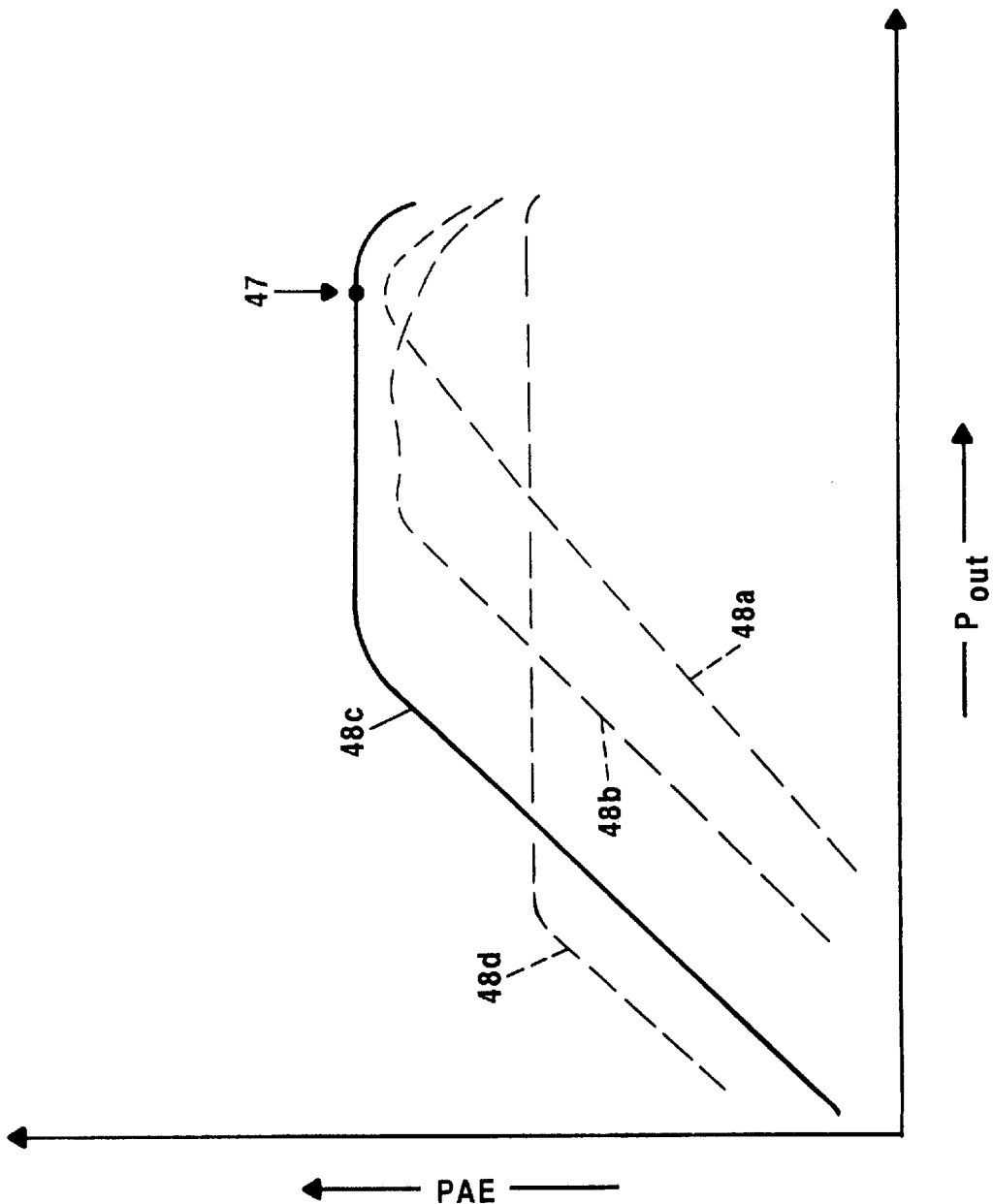

AMPLIFIER CIRCUIT

GOVERNMENT RIGHTS

Not applicable.

RELATED APPLICATIONS

Not applicable.

FIELD OF THE INVENTION

This invention relates to RF circuits and more particularly to RF power amplifier circuits.

BACKGROUND OF THE INVENTION

As is known in the art, in telecommunications systems, satellite systems and other systems, it is desirable for radio frequency (RF) power amplifiers (PAs) to linearly amplify RF signals in a highly efficient manner. Efficiency is generally proportional to input drive level. High efficiency is typically not attained until an amplifier approaches its maximum output power. This, however, is not consistent with linear operation. Thus, a tradeoff must typically be made between achieving maximum efficiency and high linearity in RF power amplifier circuits.

As is also known, so-called Doherty-type amplifiers or more simply Doherty amplifiers have been used to overcome this problem. Generally, a Doherty amplifier includes a pair of transmission paths connected in parallel between a source and a load. Each of the transmission paths includes an amplifier.

In one signal path, the amplifier is provided as a class "B" or a class "AB" amplifier (also referred to as "carrier amplifier" in the Doherty amplifier design). The carrier amplifier is designed and biased to amplify signals having relatively low signal levels. In the other signal path, the amplifier is provided as a class "C" amplifier (also referred to as a peak amplifier in the Doherty amplifier design). The peak amplifier is designed and biased such that it is off when the instantaneous value of the RF signals provided by the signal source have a signal level below a predetermined threshold. When the signal level of the RF signal fed to the peak amplifier input port reaches a predetermined threshold level, the peak amplifier is biased on and both the peak and carrier amplifiers deliver RF power to the load.

With this approach, the Doherty amplifier is able to provide an optimum power added efficiency (PAE) over a desired range of amplifier output power ($P_{out}$). An ideal Doherty amplifier has a constant PAE value over a 6 decibel (dB) range of $P_{out}$.

The carrier and peak amplifiers provided in the parallel signal paths of the Doherty amplifier may be built with high-power field effect transistors (FETs). In general, the optimum load impedance of a high power FET is relatively low at high power levels. This makes it relatively difficult to combine the signals from the carrier and peak amplifiers while at the same time maintaining a relatively high gain and PAE over a range of Doherty amplifier output power.

It would, therefore, be desirable to provide an RF power amplifier that provides a desired PAE over a relatively wide range of amplifier output power. It would also be desirable to provide an RF power amplifier that is linear and efficient for multi-carrier noise-like signals.

SUMMARY OF THE INVENTION

In accordance with the present invention, a method for providing a Doherty amplifier includes the steps of optimally matching an input impedance of a first amplification device in a first signal path, power matching an output impedance of the first amplification device to provide maximum power output, power matching the output impedance of a second amplification device in a second signal path to provide maximum power output, optimally matching the input impedance of the second amplification device under low signal conditions and providing a time delay circuit at the output of the second amplification device with the time delay circuit having a time delay selected to optimize the PAE of the Doherty amplifier. With this particular arrangement, a Doherty amplifier having a relatively high PAE over a relatively wide range of output power is provided. In one embodiment, the first signal path corresponds to a carrier amplifier signal path and the second signal path corresponds to a peak amplifier signal path. To provide an equal propagation time between the carrier amplifier signal path and the peak amplifier signal path a second delay line can be used. It should be noted that the delay in the peak amplifier signal path is comprised of input matching networks, the amplification devices, the output matching network and the delay line. Similarly, the delay in the carrier amplifier signal path is provided from the input matching network, the first amplification device and the output matching network. It should be noted that the delay required to equalize the delay through the two signal paths might be positive or negative. If the delay needed in the carrier amplifier signal path is negative, then such a delay is typically realized as a positive delay in the peak amplifier signal path. On the other hand, if the delay needed in the carrier amplifier signal path is positive, then the delay is typically realized as a positive delay in the carrier amplifier signal path. Thus, a further source of delay in the carrier amplifier signal path can be due to a delay line provided in the carrier amplifier signal path. Thus the Doherty amplifier can be provided having a first delay line which ensures that signals propagating through the carrier amplifier signal path experience the same delay as signals propagating through the peak amplifier signal path and a second delay line which provides the Doherty amplifier having an optimum PAE over a desired range of Doherty amplifier output power.

BRIEF DESCRIPTION OF THE DRAWINGS

The foregoing features of the invention, as well as the invention itself may be more fully understood from the following detailed description of the drawings, in which:

FIG. 2A is a plot of output power $P_{out}$ v. Power Added Efficiency (PAE);

DESCRIPTION OF THE PREFERRED EMBODIMENTS

Figure 1:
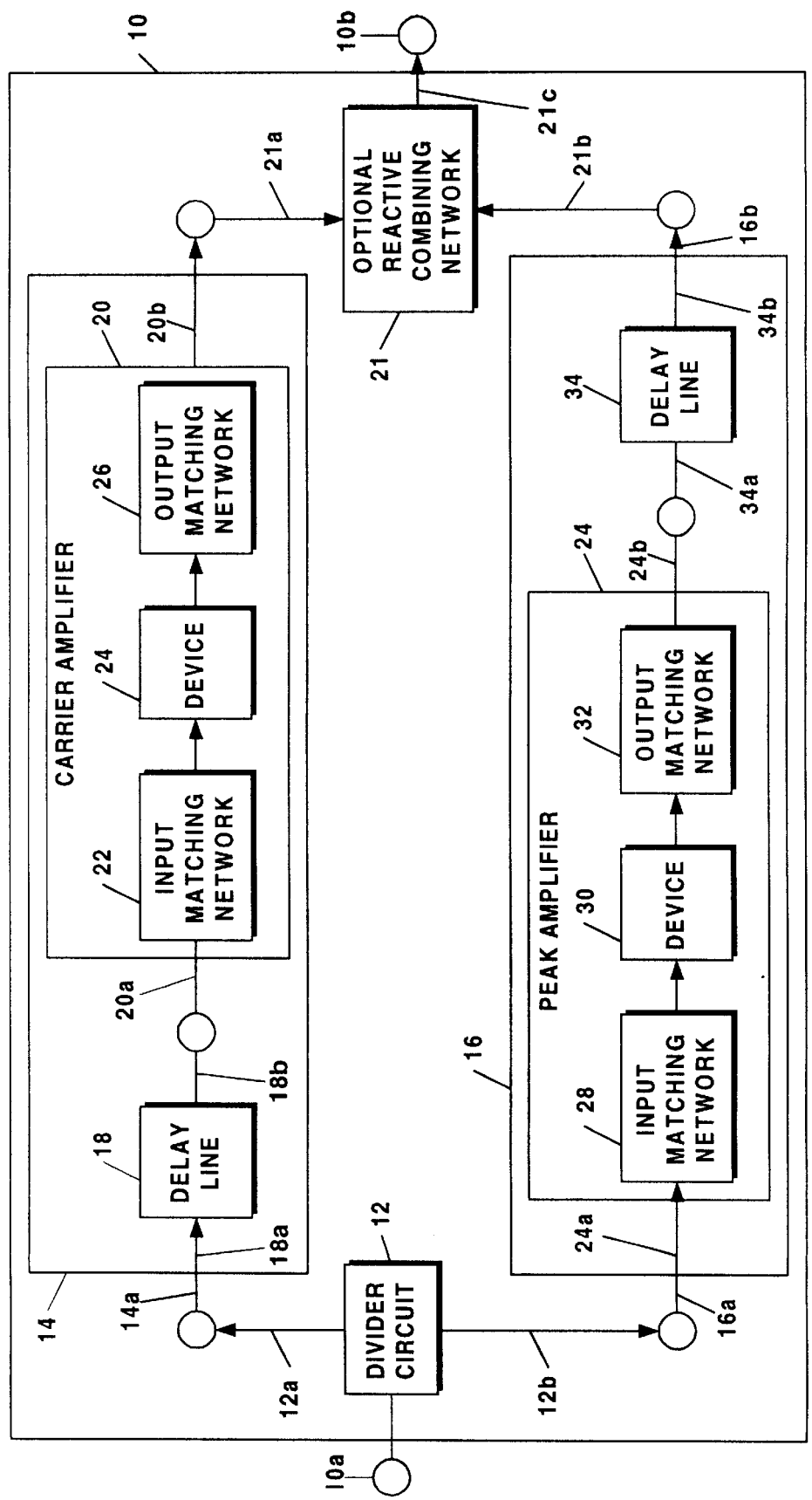
FIG. 1 is a block diagram of a radio frequency (RF) amplifier circuit.

Referring now to FIG. 1, an amplifier circuit 10 having an input port 10a and an output port 10b includes a divider circuit 12 having an input port coupled to the input port 10a of the amplifier circuit 10 and having a pair of output ports 12a, 12b. It should be appreciated that the divider circuit 12 may be provided as any type of circuit which is capable of dividing or splitting a received signal into two nominally equal portions. Divider circuit 12 may, for example, be provided from circuits including but not limited to a zero-degree hybrid coupler, a ninety-degree 3 dB hybrid coupler, a 180° 3 dB hybrid coupler, a so-called magic T or a 3 dB power divider circuit.

The output port 12a of divider circuit 12 leads to an input port 14a of a carrier amplifier signal path 14 of the amplifier circuit 10. Output port 12b of the divider circuit 12 leads to an input port 16a of a peak amplifier signal path 16 of the amplifier circuit 10. Amplifier circuit 10 includes a pair of transmission paths 14, 16 connected in parallel between the divider circuit 12 and a combiner network 21 and thus amplifier circuit 10 thus corresponds to a Doherty-type amplifier.

Considering first the carrier amplifier signal path 14, the carrier amplifier signal path 14 includes a delay line 18 having an input port 18a coupled to the input port of the carrier amplifier signal path 14 and an output port 18b coupled to a carrier amplifier 20 at an input port 20a. Carrier amplifier 20 includes an input matching network 22, an amplification device 24, and an output matching network 26. An output port of the output matching network 26 is coupled to an output port 20b of the carrier amplifier 20. It should be appreciated that the purpose of the delay line 18 is to equalize the delay in the carrier amplifier signal path 14 with the delay in the peak amplifier signal path 16.

Strictly speaking, a delay line delays a signal fed thereto by a specified time delay. This implies that the phase shift of a delay line is a linear function of frequency. A mnicrostrip transmission line is an approximation to a delay line since the phase shift of a microstrip line is not exactly a linear function of frequency (i.e. microstrip lines are dispersive). A delay line does not introduce an impedance transformation in the transmission path. It should thus be appreciated that there are many ways to implement delay lines over limited bandwidths such as with lumped element L-C networks for example.

It should be appreciated that portions or in some cases all of the delay provided by the delay line can be provided by portions of the amplifier 20 such as the input matching network 22 or the divider circuit 12. In this case, the delay line is said to be "absorbed" or "integrated" into another component such as the input matching network.

It should also be appreciated that in one particular embodiment the input and output matching networks are realized as band pass filter structures which have an associated delay. After specifying a desired magnitude and phase of a transfer function, conventional techniques can be used to design filter circuits having a desired delay. It is believed that the filter characteristics must be controlled to the second and third harmonic of the fundamental operating frequency of the amplifier.

It should also be appreciated that the carrier amplifier 20 is selected to operate as a class "A" or a class "AB" amplifier.

The amplifier output port 20b is coupled to an optional reactive combining network 21 at an input port 21a. The combining network 21 can be provided as any circuit in which the two ports coupled to amplifier output ports 20b, 24b are not isolated and where the combined signals can be provided at output port 10b.

It should also be appreciated that in this particular example the carrier and peak amplifiers 20, 24 have each been designed to operate in a fifty ohm system such that at relatively high input signal levels each amplifier 20, 24 provides equal current which add in phase. The reactive combiner 21 is needed in this case to provide an impedance characteristic to each amplifier output port 20b, 24b such that it appears to each amplifier 20, 24 that power is being delivered to a fifty ohm load.

If the carrier and peak amplifiers 20, 24 were designed to operate and provide signals into a one hundred ohm load, then the reactive power combining network would not be needed. Thus, the amplifier 10 would be more compact and also the amplifier may operate over a broader frequency range with no substantial down grade in amplifier characteristics such as gain and PAE.

It should thus be appreciated that the combining network 21 may be provided as any type of circuit which is capable of efficiently combining the signals provided thereto at ports 21a, 21b and providing an output signal at port 21c. Combining network 21 is selected to provide appropriate impedance and phase characteristics as a function of frequency and the device should allow interaction between signals presented by the carrier and peak amplifiers to the respective ports of the combiner coupled thereto.

Considering next the peak amplifier signal path 16, the peak amplifier signal path 16 includes a peak amplifier 24 having an input port 24a coupled to the output port 12b of the divider circuit 12 and an output port 24b coupled to an input port 34a of a delay line 34. The peak amplifier 24 includes an input matching network 28, an amplification device 30 and an output matching network 32.

An output port of the output matching network 32 is coupled to the output port 24b of the peak amplifier 24. It should be appreciated that the peak amplifier is selected to operate as a class "C" amplifier. In a preferred embodiment, the peak amplifier 24 is provided as a self-biasing amplifier meaning that the input signal fed to port 24a biases the amplification device 30 (e.g. a transistor such as a FET) into its "on" state when the instantaneous applied voltage exceeds a threshold.

A second port 34b of the delay line 34 is coupled to an input port 21b of the combining network 21. An output port 21c of the combining network 21 is coupled to the output port 10b of the amplifier circuit 10. The delay provided by the delay line 34 is selected to optimize he power added efficiency (PAE) of the amplifier circuit 10. In a manner similar to that discussed above in conjunction with delay line 18, delay line 34 could likewise be "absorbed" or "integrated" into either the output matching network 32 or the combining network 21.

The delay added by the delay line 34 to the peak amplifier signal path 16 results in the amplifier circuit 10 providing a relatively constant PAE over a relatively wide range of amplifier output powers ($P_{out}$). The particular delay provided by the delay line 34 which results in the amplifier circuit 10 having an optimum PAE can be found using empirical techniques.

In general, as the input drive current increases the output current provided by the carrier amplifier increases linearly. As the drive current continues to increase, then the carrier amplifier gain characteristic becomes less linear and the power amplifier provides more current. The transfer function between the Doherty amplifier input and output ports 10a, 10b, however, remains linear. This means, among other things, that a single tone provided to input port 10a would have a minimum number of harmonics at the amplifier output port 10b. The two wave forms from the carrier and power amplifiers are being combined in a manner such that, ideally, a pure sine wave results. The second and third harmonics add in the time domain also add to produce the sine wave at the output port 10b of the Doherty amplifier 10.

Because of all of the nonlinear interactions involved between the carrier and peak amplifiers, in one application the design was done empirically. Those of ordinary skill in the art will appreciate, however, that an analytic approach could also be used. Also, it should be appreciated that the linearity of the amplifier is a function of source and load impedances. The matching networks 22, 26, 28 and 32 should be thus be selected in consideration with linearity characteristics as well as other characteristics since improving the linearity of both the peak amplifier and the carrier amplifier one can reduce the intermodulation products at the output of the Doherty amplifier for a given drive level. Since distortion increases with the drive level, increasing circuit linearity allows an increase in drive level to obtain a specified distortion level and at this point the circuit is provided having a higher PAE. Thus, performance of the Doherty amplifier may be able to be improved by improving matching with respect to linearity.

Figure 2:
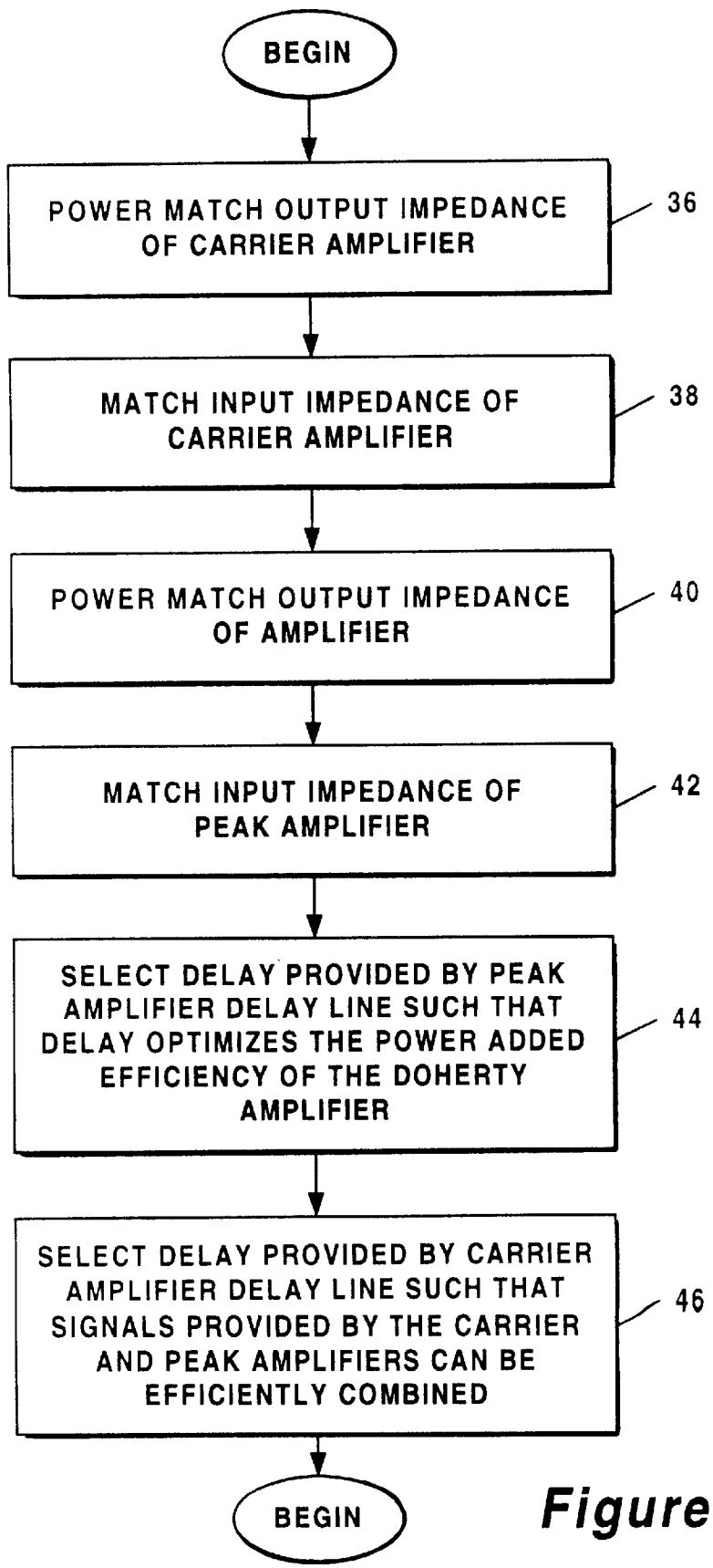
FIG. 2 is flow diagram showing the steps to provide a power amplifier having a desired PAE over a relatively wide range of amplifier output powers.

Referring now to FIG. 2, a flow diagram showing the steps to design a Doherty amplifier in accordance with the present invention are shown. The process begins in step 36 where after selecting first and second amplification devices to be used in the amplifier, an output matching network (e.g. the output matching network 26 of the carrier amplifier 20 in FIG. 1) is selected to present to the output port of the amplification device an impedance characteristic which allows the amplification device to ideally deliver maximum output power at the amplifier output port (e.g. the output port 20b of the amplifier 20).

Next, as shown in step 38, an input matching network (e.g. the input matching network 22 of the carrier amplifier 20 in FIG. 1) is selected to present to the input port of an amplification device (e.g. the amplification device 24 in FIG. 1) an impedance characteristic selected to provide a desired peak amplifier gain. If the amplification device is unconditionally stable, the input matching network can provide an impedance characteristic corresponding to a conjugate match of the input impedance characteristic of the amplification device. In the case of a device which is potentially unstable, on the other hand, it is desirable to provide an optimal match impedance (i.e. source and load impedances which result in a device which is stable over all frequencies and which simultaneously provides the desired gain and phase of the amplifier).

Processing then proceeds to step 40 in which an output matching network (e.g. the output matching network 32 of the peak amplifier 24 in FIG. 1) is provided such that it presents to the output port of an amplification device (e.g. the amplification device 30 in FIG. 1) an impedance characteristic which allows the amplification device to ideally deliver maximum output power at an amplifier output port (e.g. the output port 24b of the amplifier 24 in FIG. 1).

Processing then proceeds to step 42 where an input matching network (e.g. the input matching network 28 of the peak amplifier 24 in FIG. 1) is provided having an impedance characteristic which presents to the input port of the amplification device 30 (e.g. the amplification device 30) an impedance characteristic corresponding to an optimal match of the input impedance of the amplification device. The optimal match impedance characteristic of the input matching network is such that the optimal match occurs when the peak amplifier has a relatively low input signal level provided to the input port thereof (i.e. when the amplifier 24 in FIG. 1 is in its "backed-off" state (e.g. 3–5 dB below the 1dB compression point).

Next as shown in steps 44 and 46 the delay for the delay lines in each of the carrier and peak amplifier signal paths (e.g. delay lines 18, 34 in each of the carrier and peak amplifier signal paths 14, 16 in FIG. 1) are selected. As mentioned above, the purpose of the delay line 18 in the carrier amplifier signal path 14 is to equalize the delay in the carrier amplifier and peak amplifier signal paths 14, 16. In some instances, the path length of the carrier signal path may be less than the path length of the peak amplifier signal path, while in other instances, the path length of the carrier signal path may be greater than the path length of the peak amplifier signal path while in still other instances, the path length of the carrier signal path may be equal to the path length of the peak amplifier signal path. Thus, it is possible that the delay required by the carrier amplifier signal path delay line (e.g. delay line 18 in FIG. 1) could be a positive delay line, a negative line, or zero delay.

In the case where a zero delay is required, the delay line (e.g. delay line 18) is simply omitted. In the case where a negative delay is required, the delay line 18 could be realized as a positive delay in the peak amplifier signal path 16. Thus in this case, the signal path 14 would not include a delay line and signal path 16 could include two delay lines (e.g. delay lines 18, 34 in FIG. 1).

The delay provided by delay line 34 in the peak amplifier signal path 16 is selected to optimize the power-added-efficiency (PAE) of the Doherty amplifier 10. To select the delay provided by the delay line 34, it must be appreciated that the signals propagating through delay 18 and delay 34 must interact because they must combine at the output port 10b (e.g. through the combiner 21). Thus, if a change is made to delay line 18, then a change must also be made in delay line 34. Initially, one can select/change delay line 34 and measure a specific value of $P_{out}$. Then an adjustment can be made to the delay provided by the delay line 18 to maximize the PAE. Next, $P_{out}$ is reduced and the PAE is observed as a function of $P_{out}$. These steps are repeated until a pair of delay values to be provided by delay lines 18, 34 are found which provide the Doherty amplifier 10 having a desired PAE characteristic.

Referring to FIG. 2A, the effects of the delay provided by delay line 34 are shown. If delay line 34 provides little or no delay, the PAE curve 48a results as the delay provided by delay line 34 increases the curves 48b–48d result. The shifts in the PAE curves 48a–48d result because the delay provided by delay line 34 influences or controls interactions between the carrier and peak amplifiers. These interactions are non-linear because they involve both fundamental frequency signals and signals at harmonics. Since it is desired to have a linear amplifier, all the signals should add in phase at the Doherty amplifier output port.

It should be appreciated that the particular delays provided by the delay lines in the carrier and peak amplifier signal paths (e.g. delay line 18 and delay line 34) may be selected using empirical techniques.

Figure 3:
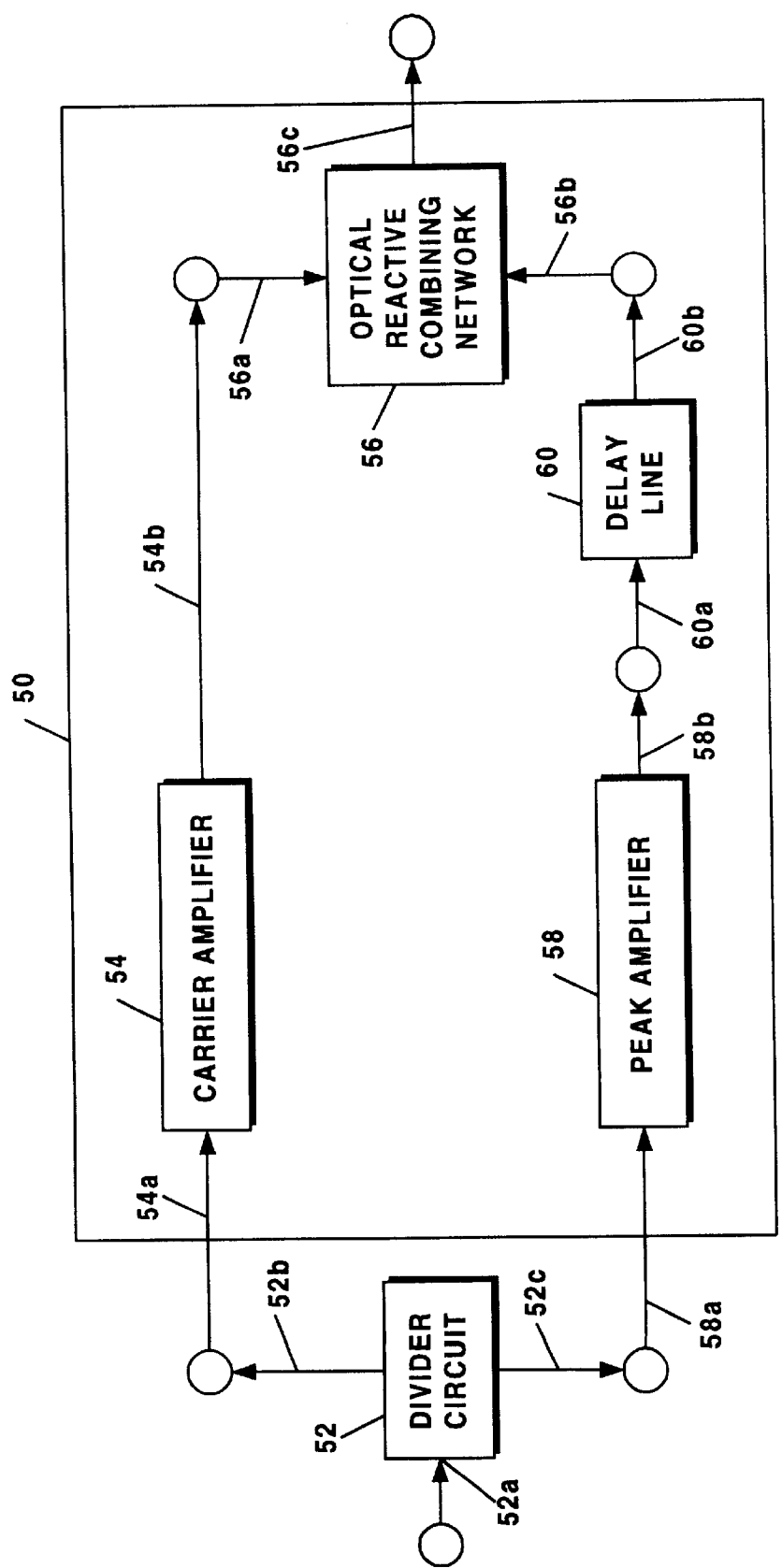
FIG. 3 is a block diagram of an alternate embodiment of a radio frequency (RF) amplifier circuit.

Referring now to FIG. 3, an amplifier circuit 50 includes an optional divider circuit 52 having an input port 52a and a pair of output ports 52b, 52c. Output port 52b is coupled to a carrier amplifier 54 at an input port 54a. An output port 54b of the carrier amplifier 54 is coupled to a combining network 56 at an input port 56a.

The output port 52c of the divider circuit 52 is coupled to an input port 58a of a peak amplifier 58 and an output port 58b of the peak amplifier 58 is coupled to a delay line 60 at an input port 60a. An output port 60b of the delay line 60 is coupled to the combining network 56 at an input port 56b.

In operation, a signal source (not shown) provides a signal to the input port of the divider circuit 52. It should be appreciated that the divider circuit 52 may be provided as any type of circuit which is capable of dividing or splitting a received signal into two substantially equal portions. Divider circuit 52 may, for example, be provided from circuits including but not limited to a zero-degree hybrid coupler, a ninety-degree 3 dB hybrid coupler, a 3 dB 180° hybrid coupler, a so-called magic T or a 3 dB power divider circuit.

Each of the divided signals are fed to respective ones of the carrier and peak amplifiers 54, 58. In this particular example, the electrical signal path lengths of the carrier and peak amplifier signal paths (i.e. the path lengths from the outputs 52b, 52c of divider circuit 52 to the inputs 56a, 56b respectively of the combining network 56) are substantially the same. Since the signal path lengths are the same, it is not necessary to include a delay line in the carrier amplifier signal path (as shown in FIG. 1) to equalize the delay between the carrier and peak amplifier signal paths. Thus, the combining network 56 is able to receive the signals fed thereto at ports 56a and 56b and efficiently combine the signals to provide an amplifier output signal at the output port 56c.

It should be appreciated that the combining network 56 may be provided as any type of circuit which is capable of efficiently combining signals fed thereto and providing an output signal at the output port 56c. Combining network 56 be provided as discussed above in conjunction with combiner circuit 21 shown in FIG. 1.

When the signal level at port 58a is of sufficient strength to bias the peak amplifier 58 into its amplification state, the delay line 60 causes the amplifier 50 to provide a relatively constant PAE over a relatively wide range of amplifier output power.

Figure 4:
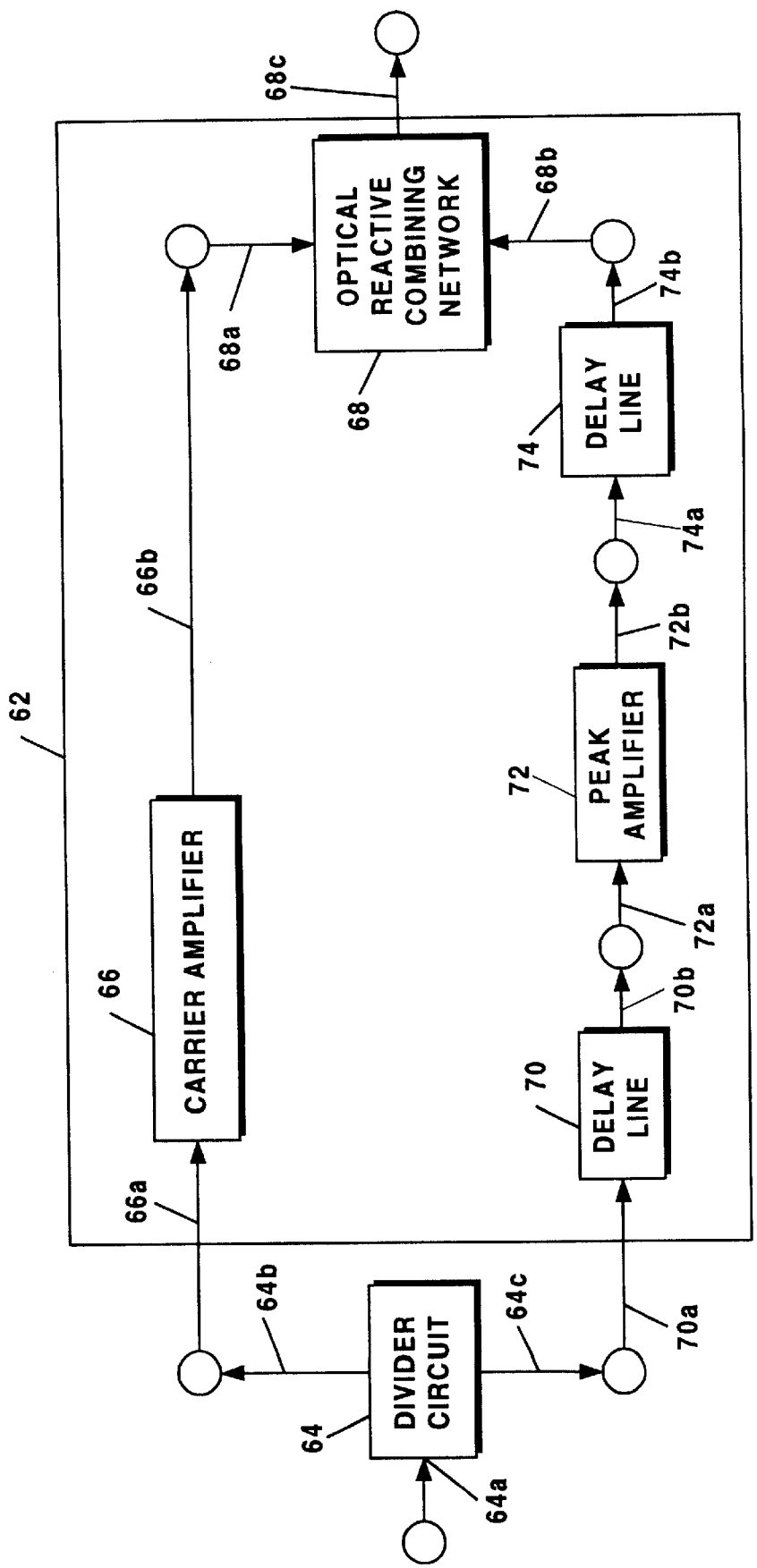
FIG. 4 is a block diagram of yet another alternate embodiment of a radio frequency (RF) amplifier circuit.

Referring now to FIG. 4, a Doherty amplifier 62 includes a divider circuit 64 which may be provided as any of the types described above in conjunction with FIGS. 1 and 3 having an input port 64a and a pair of output ports 64b, 64c. Output port 64b is coupled to a carrier amplifier 66 at an input port 66a. An output port 66b of carrier amplifier 66 is coupled to a circuit combiner 68 at an input port 68a.

In this particular embodiment, the peak amplifier signal path includes a first delay line 70 having a delay selected to equalize the electrical path lengths of the carrier amplifier signal path (i.e. the path length between the output port 64b of the divider 64 and the input 68a of the combining network 68) and the peak amplifier signal path (i.e. the path length between the output port 64c of the divider 64 and the input 68b of the combining network 68). Thus, the second output port 64c of the divider circuit 64 is coupled to a first delay line 70 at an input port 70a and a second port 70b of the delay line 70 is coupled to an input port 72a of a peak amplifier 72.

An output port 72b of the peak amplifier 72 is coupled to a second delay line 74 at an input port 74a and a second output port 74b of the second delay line 74 is coupled to the combining network at a second input port 68b. The signals fed to the input ports 68a, 68b of the combining network 68 are combined and an amplifier output signal is provided at the port 68c of the combining network 68.

Figure 5:
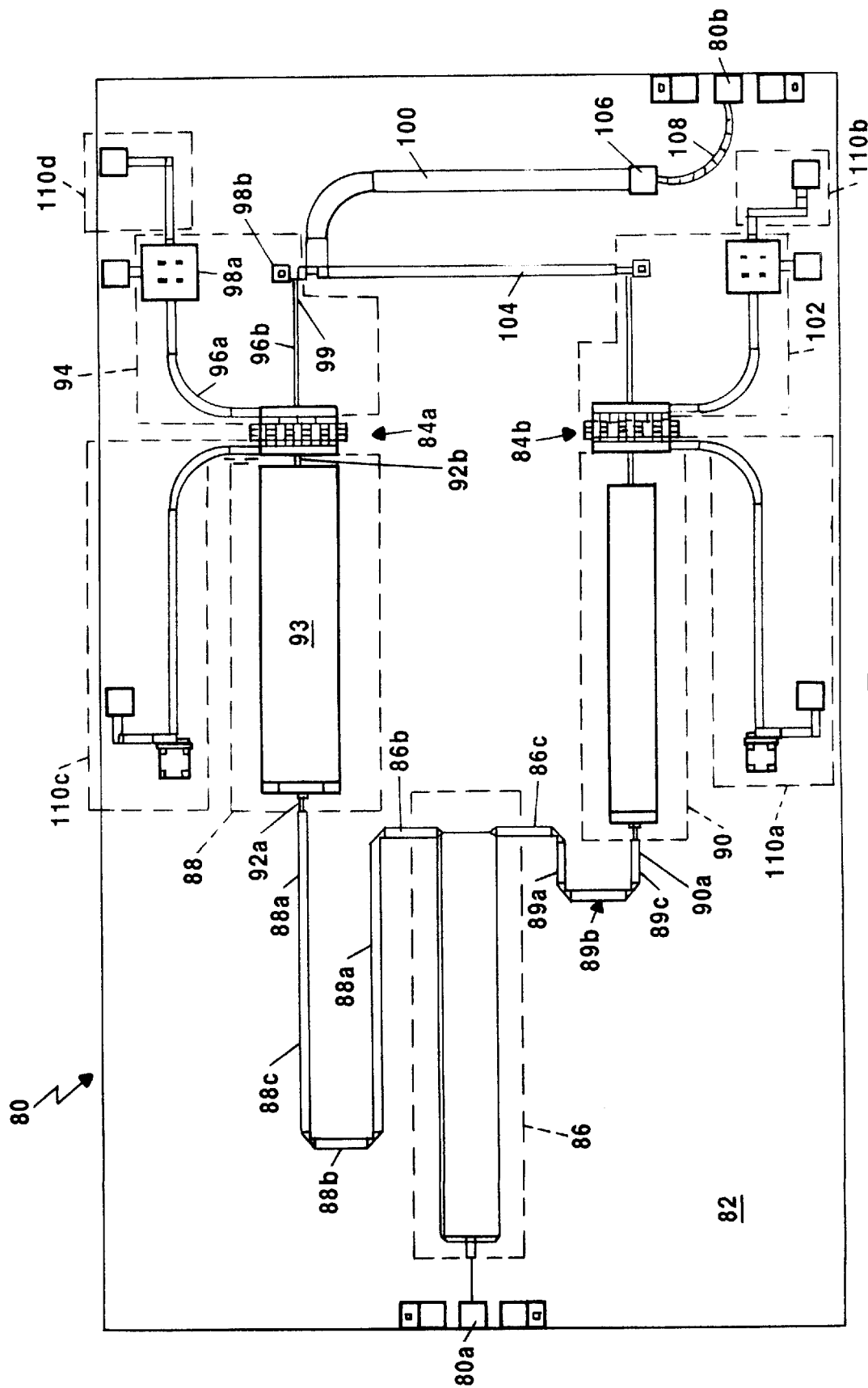
FIG. 5 is a plan view of an RF amplifier circuit implemented as a monolithic microwave integrated circuit (MMIC).

Referring now to FIG. 5, an embodiment of an amplifier circuit 80 is shown fabricated as a monolithic microwave integrated circuit (MMIC) 80 having input and output terminals 80a and 80b. The amplifier circuit 80 is disposed on a substrate 82 here comprised of gallium arsenide or other suitable microwave/millimeter wave substrate material. The substrate 82 has disposed on a bottom surface thereof a ground plane conductor 83. The substrate 82 has disposed over a top surface thereof a plurality of strip conductors and a pair of amplification devices 84a, 84b. The amplification devices 84a, 84b are typically provided having like electrical characteristics. In this particular embodiment, the amplification devices 84c, 84b are provided as field effect transistors (FETs).

The strip conductors provide transmission line sections which provide a divider circuit 86 here provided as a Wilkinson power divider circuit having an input port 86c coupled to amplifier input port 80a and a pair of output ports 86b, 86c. Output port 86b is coupled through transmission lines 88a–88c to an input port of an input matching circuit 88.

Similarly, the output port 86c is coupled through transmission line sections 89a, 89b, 89c to an input port of an input matching network 90. The transmission line sections 88a–88c act as a delay line and thus provide a predetermined delay relative to those signals propagating from port 86b to port 88a as compared with those signals propagating from port 86c to port 90a.

In the embodiment shown in FIG. 5, the hybrid junction used in the MMIC amplifier 80 is a Wilkinson coupler 86. As is known, the fourth port of a Wilkinson coupler is internal to the hybrid and is terminated in an internal 100 ohm resistor.

As discussed above, the reason for specifying the divider circuit (such as divider circuit 12 in FIG. 1) as a hybrid power divider is to provide isolation between the ports coupled to the carrier and peak amplifiers at the fundamental frequency. Any implementation of a hybrid coupler (i.e. a power divider which is matched at all external ports and provides isolation between the two output ports) could also be used.

Over a limited bandwidth the addition of an external transmission line, such as transmission line 88a having an electrical path length of ninety degrees and having a characteristic impedance equal to that of the hybrid, in series with one of the hybrid output ports can be used to convert a 0° hybrid (such as the Wilkinson divider 86) for example, to a 90° hybrid coupler circuit.

The matching networks 88, 90 provide appropriate impedance matching characteristics and delay characteristics between the power divider circuit 86 and the amplification devices 84a, 84b as discussed above. The details of network 88 are provided below. Network 90 is implemented in a similar manner. It should be appreciated that there are many techniques for realizing networks 88, 90 and that the description provided herein below is not intended to be limiting of the invention but rather is intended to provide an example of one implementation out of many possible implementations.

The matching circuit 88 includes a pair of inductive elements 92a and 92b and a transmission line section 93 coupled therebetween. In this particular implementation, the inductor 92b and the capacitance of the amplification device 84a form one resonator and the transmission line section 93 acts like an impedance inverter between the two series resonant circuits (i.e. inductor 92a and the resonator formed by inductor 92b and the capacitance of amplification device 84a) to thus provide a two section band pass filter (BPF) matching network 88. Thus, the input matching network 88, in this particular embodiment, corresponds to a two section BPF realized using an impedance inverter.

An output matching network 94 implemented via a transmission line sections 96a, 96b capacitors 98a, 98b and an inductor 99 couple the output of the amplification device 84a to a first end of a reactive network 100. The length of transmission line section 96b affects the impedance characteristics presented to harmonic frequency signals and thus can be used to tune the harmonic frequency signals.

An output matching network 102 implemented in a manner similar to network 94 couples the output of amplification device 84b to a first end of a delay line 104. A second end of the delay line 104 is coupled to the first end of the reactive network 100. A second end of the reactive network 100 is coupled to amplifier output port 80b through a D.C. blocking capacitor 106 and an impedance line section 108 having an impedance characteristic selected to provide a suitable impedance match at the output port 80b.

It should be appreciated that in this particular implementation circuits 102 and 94 are identical. In many applications, however, the performance characteristics of the amplifier 80 can be improved by using circuit 94 and 102 which are different.

Bias circuits 110a–110d provide a means for introducing bias signals to the appropriate sections of the amplifier 80.

It should be appreciated that various circuit variations substitutions well-within the skill of one of ordinary skill in the art can be made in amplifier circuit 80 and that such changes have no impact on the essence of the invention. For example, Wilkinson power divider 86 and transmission line section 88a could be replaced by a Lange Coupler which would provide circuit characteristics substantially the same as the combination of the power divider 86 and transmission line 88a, but which would be a more compact structure and thus possibly more desirable in some applications. It should also be appreciated that other techniques (e.g. quasi-lumped element techniques) can also be used to provide compact circuits having functional characteristics which are equivalent to those circuits described above. Thus, while the circuit shown in FIG. 5 utilizes primarily all distributed matching networks, in some applications compact matching networks may be preferred.

It should also be appreciated that in the specific implementation of the Doherty amplifier discussed hereinabove, the output matching networks of the Carrier and Peak amplifiers could be designed to operate into a 100 Ohm load rather than a 50 Ohm load. In this case the optional reactive combining network 100 would not be required. Special care would be required in order to present the optimum simultaneous load impedances to both the Peak and Carrier amplifiers at the second and third harmonics of the input frequency.

Generally in order to maximize the efficiency of an amplifier, it is desirable to have the AC currents, I(t), flowing into the output of the active devices to be in phase quadrature with the AC voltage, V(t), across the device at the fundamental, second harmonic and third harmonic (and ideally all harmonics). Since the energy dissipated in the device is the integral of V(t)*I(t) over one period of the fundamental, if V(t) and I(t) are in phase quadrature the integral is zero and the power dissipated in the device is minimized. In effect the impedances presented at the fundamental and harmonic frequencies provide wave shaping in the time domain which can be used to optimize the device efficiency.

In addition to these AC contributions to power dissipation in the device, the DC current through the device multiplied by the DC voltage across the device is the dominant contribution to power dissipation. The Doherty amplifier of the present invention reduces (divides by 2) the DC current in the backed off state and thus maximizes efficiency under these conditions.

A reactive combining network does not provide any isolation between the outputs of the two amplifiers which are being combined. Thus, use of a hybrid coupler to act as a combiner circuit would tend to result in a circuit which does not operate as effectively (and possibly may not operate in a desired manner) as the circuits described above.

It should be noted that transmission length sections and transmission line resonators are smoothly curved since abrupt strip conductor discontinuities provide abrupt impedance changes to high frequency signals. Such impedance discontinuities often cause undesirable radiation of propagating energy particularly at high frequencies. Thus, the use of smoothly curved transmission length sections, transmission line resonators, and mitered corners provides compact signal paths having well matched impedances to high frequency signals propagating thereto.

In the design of one particular circuit a pseudomorphic high electron mobility transistor (PHEMT) was used. It should be noted that the load impedance for the carrier amplifier, at low power levels is chosen to maximize the gain of the amplifier under these conditions. As the frequency of operation increased the maximum stable gain of this particular PHEMT decreased and the stability factor increased. Near an operating frequency of about 18 GHz, the stability factor became greater than 1 and the maximum available gain (MAG) of the device could be calculated using small signal scattering parameters. In an initial Doherty amplifier designed for operation at about 19.5 GHz calculations were done using small signal scattering parameters derived from a small signal equivalent circuit for a 0.15 $\mu$m ISV PHEMT with 10 gate fingers each 60 $\mu$m long. At 19.5 GHz the MAG, of this device was calculated to be 13.3 dB. The device gain is reduced by approximately 2.9 dB when the drain is terminated in a maximum power load. This reduces the amplifier available gain to approximately 10.4 dB. In addition, the presence of a 3 dB hybrid at the Doherty amplifier input reduces the available gain by an additional 3 dB, thus reducing the net available Doherty amplifier gain to approximately 7.4 dB. A portion of the 3 dB hybrid loss is recovered by terminating the carrier amplifier matching network with the optimum load under low power conditions. These considerations limit a 20 GHz Doherty amplifier to approximately 8.4 dB of small signal gain. Clearly it is necessary to pay close attention to the small signal amplifier gain near 20 GHz in order to produce an amplifier with useful gain in typical system applications.

All references cited herein are hereby incorporated herein by reference in their entirety.

Having described preferred embodiments of the invention, it will now become apparent to one of ordinary skill in the art that other embodiments incorporating their concepts may be used. For example, the technique of the present invention is not limited to use with FETs. It should be understood that the techniques described herein work with any active three terminal device. It should be appreciated, of course that the details of the implementation with different devices would of course be different. It is felt therefore that these embodiments should not be limited to disclosed embodiments, but rather should be limited only by the spirit and scope of the appended claims.

What is claimed is:

1. An amplifier circuit having an input port and an output port, the amplifier circuit comprising:
   a carrier amplifier having an input port coupled to the input port of the amplifier circuit and having an output port;
   a peak amplifier having an input port coupled to the input port of the amplifier circuit and having an output port; and
   a first delay line having a first port coupled to the output port of said peak amplifier and having a second port coupled to the output port of the amplifier, wherein said first delay line has a delay characteristic selected to optimize the power added efficiency of the amplifier circuit and said first delay line does not introduce an impedance transformation.

2. The amplifier circuit of claim 1 further comprising a divider circuit having a first port coupled to the input port of the amplifier circuit, a second port coupled to the input port of said carrier amplifier and a third port coupled to the input port of said peak amplifier.

3. The amplifier of claim 2 further comprising a combining network having a first port coupled to the output port of said carrier amplifier, a second port coupled to the second port of the delay line and a third port coupled to the output port of the amplifier circuit.

4. The amplifier circuit of claim 1 wherein said carrier amplifier comprises:
   an amplification device having a first port and a second port;
   an input matching network having an input port coupled to the input port of said carrier amplifier and an output port coupled to the first port of said amplification device, said input matching network having an impedance characteristic such that it provides an optimal match impedance characteristic to the first port of said amplification device; and
   an output matching network having an input port coupled to the second port of said amplification device and an output port coupled to the output port of said carrier amplifier.

5. The amplifier circuit of claim 4 wherein said output matching network of said carrier amplifier presents an impedance characteristic to the second port of said amplification device which maximizes the output power of said carrier amplifier.

6. The amplifier circuit of claim 1 wherein said peak amplifier comprises:
   an amplification device having a first port and a second port;
   an input matching network having an input port coupled to the first port of said peak amplifier and having an output port coupled to the first port of said amplification device, said input matching network having an impedance characteristic such that it provides an optimal match impedance characteristic to the first port of said amplification device; and
   an output matching network having an input port coupled to the second port of said amplification device and having an output port coupled to the first port of said first delay line.

7. The amplifier circuit of claim 6 wherein:
   said input matching network of said peak amplifier presents a predetermined impedance characteristic to the first port and said amplification device under low signal conditions; and
   said output matching network is provided having an impedance matching characteristic such that the peak amplifier provides a maximum output power.

8. The amplifier circuit of claim 1 wherein said first delay line is provided having a delay characteristic selected to optimize the power added efficiency of the amplifier circuit in the backed off state.

9. The amplifier circuit of claim 8 further comprising a second delay line coupled between the output port of said divider circuit and the input port of said peak amplifier circuit wherein said second delay line equalizes the path length between a signal path extending from the input port of said carrier amplifier to the first input port of said combining network and a signal path extending from input port of said peak amplifier to the second input port of said combining network.

10. The amplifier circuit of claim 8 wherein the carrier amplifier is disposed in a carrier amplifier signal path and the peak amplifier is disposed in a peak amplifier signal path and the amplifier circuit further comprises:
    a second delay line coupled between the first output port of said divider circuit and the input port of said carrier amplifier, said second delay line having a delay which equalizes the signal path lengths between the carrier and peak amplifier signal paths.

11. An amplifier circuit comprising:
    (a) a peak amplifier signal path, said peak amplifier signal path comprising:
        a peak amplifier having an input port and an output port; and
        means, coupled to said peak amplifier, for optimizing the power added efficiency of said peak amplifier in the backed off state wherein said means does not introduce an impedance transformation; and
    (b) a carrier amplifier signal path, said carrier amplifier signal path comprising:
        a carrier amplifier having an input port and output port; and
        means, coupled to said carrier amplifier, for equalizing the time delay in said carrier amplifier signal path and said peak amplifier signal path.

12. The amplifier circuit of claim 11 wherein said first means is provided as a first delay line having an input port coupled to the output port of said peak amplifier and having an output port coupled to the output of the amplifier circuit.

13. The amplifier circuit of claim 12 wherein said second means is provided as a second delay line having an input port coupled to the input port of the amplifier circuit and having an output port coupled to the input port of said carrier amplifier.

14. The amplifier circuit of claim 11 further comprising:
    a combining network having a first input port coupled to the output port of said first delay line and having a second input port coupled to the output port of said carrier amplifier and having an output port coupled to the output port of said amplifier circuit.

15. The amplifier circuit of claim 13 further comprising:
    a divider circuit having an input port coupled to the input port of the amplifier circuit, having a first output port coupled to the input port of said peak amplifier, and having a second output port coupled to an input port of a second delay line wherein said second delay line has a second port coupled to the input port of said carrier amplifier.

16. The amplifier circuit of claim 13 wherein said first delay line is provided as a transmission line having a predetermined impedance characteristic and a predetermined electrical path length.

17. The amplifier of claim 13 wherein said second delay line is provided as a transmission line having a predetermined impedance characteristic and a predetermined electrical path length.

18. The amplifier of claim 15 wherein:

said carrier amplifier input matching network is provided as a bandpass filter; and the input matching network of said peak amplifier is provided as a bandpass filter.

19. The amplifier of claim 18 wherein said first and second delay lines are implemented as lumped element circuits.

20. A method for providing an amplifier circuit comprising the steps of:

providing a first amplifying device;

matching the input impedance of said first amplifier device;

power matching the output impedance of said first amplifier device;

providing a second amplifying device;

power matching the output impedance of said second amplifying device;

matching the input impedance of said second amplifier device under low signal conditions;

selecting a delay line coupled to the output port of the second amplifying device such that the second delay line provides a delay chosen to optimize the power added efficiency of the amplifier in the backed off state; and selecting a delay line provided by a second delay line coupled to the input port of said first amplifying device such that the delay provided by the second delay line equalizes the signal path length from the input of the delay line through the output of the output matching network coupled to the first amplifying device and the input port of the input matching network coupled to the second amplifying device to the output port of the second delay line.

21. The method of claim 20 wherein the first amplifying device corresponds to a carrier amplifier and the second amplifying device corresponds to a peak amplifier and wherein the delay provided by the peak amplifier delay line is selected such that the signals provided by the carrier amplifier and the peak amplifier can be efficiently combined.

22. The method of claim 21 wherein the delay provided by the peak amplifier delay line is selected such that the delay optimizes the power added efficiency of the amplifier circuit in the backed off state.

23. The method of claim 22 wherein the step of selecting the delay provided by the peak amplifier delay line includes the steps of:

(a) selecting a delay;

(b) measuring the power added efficiency of the amplifier circuit in the backed off state;

(c) comparing the measured power added efficiency value to a threshold power added efficiency value; and (d) repeating steps (a)–(c) until a delay is achieved which provides an optimum power added efficiency value.

24. The method of claim 23 wherein the step of selecting the delay provided by the carrier amplifier includes the steps of:

(e) selecting a delay for the carrier amplifier delay line;

(f) measuring the output power of the amplifier;

(g) comparing the measured output value to threshold value; and (h) repeating steps (e)–(g) until the amplifier circuit provides an optimum output power.

25. A method for providing an amplifier circuit comprising the steps of:

providing a first amplifying device;

matching the input impedance of said first amplifier device;

power matching the output impedance of said first amplifier device;

providing a second amplifying device;

power matching the output impedance of said second amplifying device;

matching the input impedance of said second amplifier device under low signal conditions;

selecting a delay line coupled to the output port of the second amplifying device such that the second delay line provides a delay chosen to optimize the power added efficiency of the amplifier in the backed off state; and selecting a delay line provided by a second delay line coupled to the input port of said first amplifying device such that the delay provided by the second delay line equalizes the signal path length from the input of the delay line through the output of the output matching network coupled to the first amplifying device and the input port of the input matching network coupled to the second amplifying device to the output port of the second delay line;

wherein the first amplifying device corresponds to a carrier amplifier and the second amplifying device corresponds to a peak amplifier and wherein the delay provided by the peak amplifier delay line is selected such that the signals provided by the carrier amplifier and the peak amplifier can be efficiently combined and to optimize the power added efficiency of the amplifier circuit in the backed off state.

26. The method of claim 25 wherein the step of selecting the delay provided by the peak amplifier delay line includes the steps of:

(a) selecting a delay;

(b) measuring the power added efficiency of the amplifier circuit in the backed off state;

(c) comparing the measured power added efficiency value to a threshold power added efficiency value; and (d) repeating steps (a)–(c) until a delay is achieved which provides an optimum power added efficiency value.

27. The method of claim 26 wherein the step of selecting the delay provided by the carrier amplifier includes the steps of:

(e) selecting a delay for the carrier amplifier delay line;

(f) measuring the output power of the amplifier;

(g) comparing the measured output value to threshold value; and (h) repeating steps (e)–(g) until the amplifier circuit provides an optimum output power.

28. An amplifier circuit having an input port and an output port, the amplifier circuit comprising:

a carrier amplifier having an input port coupled to the input port of the amplifier circuit and having an output port;

a peak amplifier having an input port coupled to the input port of the amplifier circuit and having an output port; and a first delay line having a first port coupled to the output port of said peak amplifier and having a second port coupled to the output port of the amplifier, wherein said first delay line provides a phase shift and said phase shift is a linear function of frequency and said first delay line does not introduce an impedance transformation.

* * * * *